US007167063B2

(12) United States Patent
Yavorskyy et al.

(10) Patent No.: US 7,167,063 B2
(45) Date of Patent: Jan. 23, 2007

(54) METHOD AND APPARATUS FOR REDUCED NOISE BAND SWITCHING CIRCUITS

(75) Inventors: Volodymyr Yavorskyy, Waterloo (CA); Tajinder Manku, Waterloo (CA); James Wei, Scarborough (CA)

(73) Assignee: Sirific Wireless Corporation, Waterloo (CA)

(*) Notice: Subject to any disclaimer, the term of this patent is extended or adjusted under 35 U.S.C. 154(b) by 0 days.

(21) Appl. No.: 11/018,846

(22) Filed: Dec. 22, 2004

(65) Prior Publication Data

US 2005/0134392 A1 Jun. 23, 2005

Related U.S. Application Data

(60) Provisional application No. 60/531,609, filed on Dec. 23, 2003.

(51) Int. Cl.
*H03B 5/00* (2006.01)
(52) U.S. Cl. ............... 331/185; 331/36 C; 331/177 V; 331/177 R; 331/34
(58) Field of Classification Search .......... 331/117 FE, 331/167, 177 V, 175, 185, 34, 36 C
See application file for complete search history.

(56) References Cited

U.S. PATENT DOCUMENTS 6,150,893 A 11/2000 Fattaruso

| 6,181,211 | B1 | 1/2001 | Aho et al. |
| 6,411,171 | B1 | 6/2002 | Nobuyuki |
| 6,545,555 | B1 | 4/2003 | Bengtsson et al. |
| 6,650,195 | B1 | 11/2003 | Taylor et al. |
| 6,674,333 | B1 | 1/2004 | Peckham et al. |
| 6,943,637 | B1 * | 9/2005 | Ruffieux ............... 331/117 FE |

OTHER PUBLICATIONS

Joseph, Alvin J., et al., Product Applications and Technology Directions With SiGe BiCMOS, IEEE Journal of Solid-State Circuits, vol. 38, No. 9, Sep. 2003, pp. 1471-1478.
Curtin, Mike, et al., Phase-Locked Loops for High-Frequency Receivers and Transmitters-Part 2, Analog Dialogue 33-5, pp. 1-5.

* cited by examiner

*Primary Examiner*—Arnold Kinkead
(74) *Attorney, Agent, or Firm*—Jeffrey W. Wong; Borden Ladner Gervais LLP

(57) ABSTRACT

A low-phase noise voltage control oscillator (VCO) comprising a voltage source for supplying control voltage to the VCO core; a phase lock loop, having an output connected to an input of the voltage source; a VCO core, including an amplifier circuit with noiseless biasing and a tank circuit with noiseless biasing of the varactors; having an output connected to an input of the phase lock loop; and an attenuator, located between the voltage source and the VCO core, for reducing phase noise from the voltage source to the VCO core.

17 Claims, 11 Drawing Sheets

METHOD AND APPARATUS FOR REDUCED NOISE BAND SWITCHING CIRCUITS

CROSS REFERENCE TO RELATED APPLICATIONS

This application claims the benefit of U.S. Provisional Application No. 60/531,609, filed Dec. 23, 2003, which is incorporated herein by reference.

FIELD OF THE INVENTION

The invention relates generally to the field of oscillators. More specifically, this invention relates to voltage controlled oscillators for signal generation in wireless communication applications.

BACKGROUND OF THE INVENTION

A voltage-controlled oscillator (VCO) is a circuit that produces an oscillating signal using amplification, feedback and a resonant circuit to generate a repeating voltage waveform, such that its output frequency is proportional to its input voltage.

In wireless communication applications, VCOs operate over large frequency ranges. VCO's generally comprise a tank circuit and an amplifier circuit, operation of which will be well known. Biasing of such circuits is also known and described in U.S. Pat. No. 6,674,333 to Peckham et al, which describes a method for operating a band switchable VCO in different frequency bands. In typical band switching circuits, biasing of the amplifier or a tank circuit introduces noise which results in phase noise being present in the output of the VCO.

It is, therefore, desirable to provide a method and apparatus for reduced noise band switching circuits.

SUMMARY OF THE INVENTION

It is an object of the present invention to obviate or mitigate at least one disadvantage of previous voltage control oscillator circuits.

In a first aspect, the present invention provides a low-phase noise voltage control oscillator (VCO) comprising a voltage source for supplying a control voltage to the VCO core; a phase lock loop, having an output connected to an input of the voltage source; a VCO core, including an amplifier circuit and a tank circuit; having an output connected to an input of the phase lock loop; a capacitance divider circuit attenuator, located between the voltage source and the VCO core, for reducing noise from the voltage source to the VCO core to reduce frequency variation of the voltage source.

In a further embodiment, there is provided a method of reducing noise in a voltage control oscillator (VCO) comprising the steps of providing an attenuated voltage to a VCO core comprising an amplifier circuit and a tank circuit; and biasing the amplifier circuit via an amplifier bias including amplifier switches and the tank circuit via a tank bias including tank switches, to reduce noise in an output of the VCO core.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and apparatus for reduced noise band switching circuits.

Figure 1:
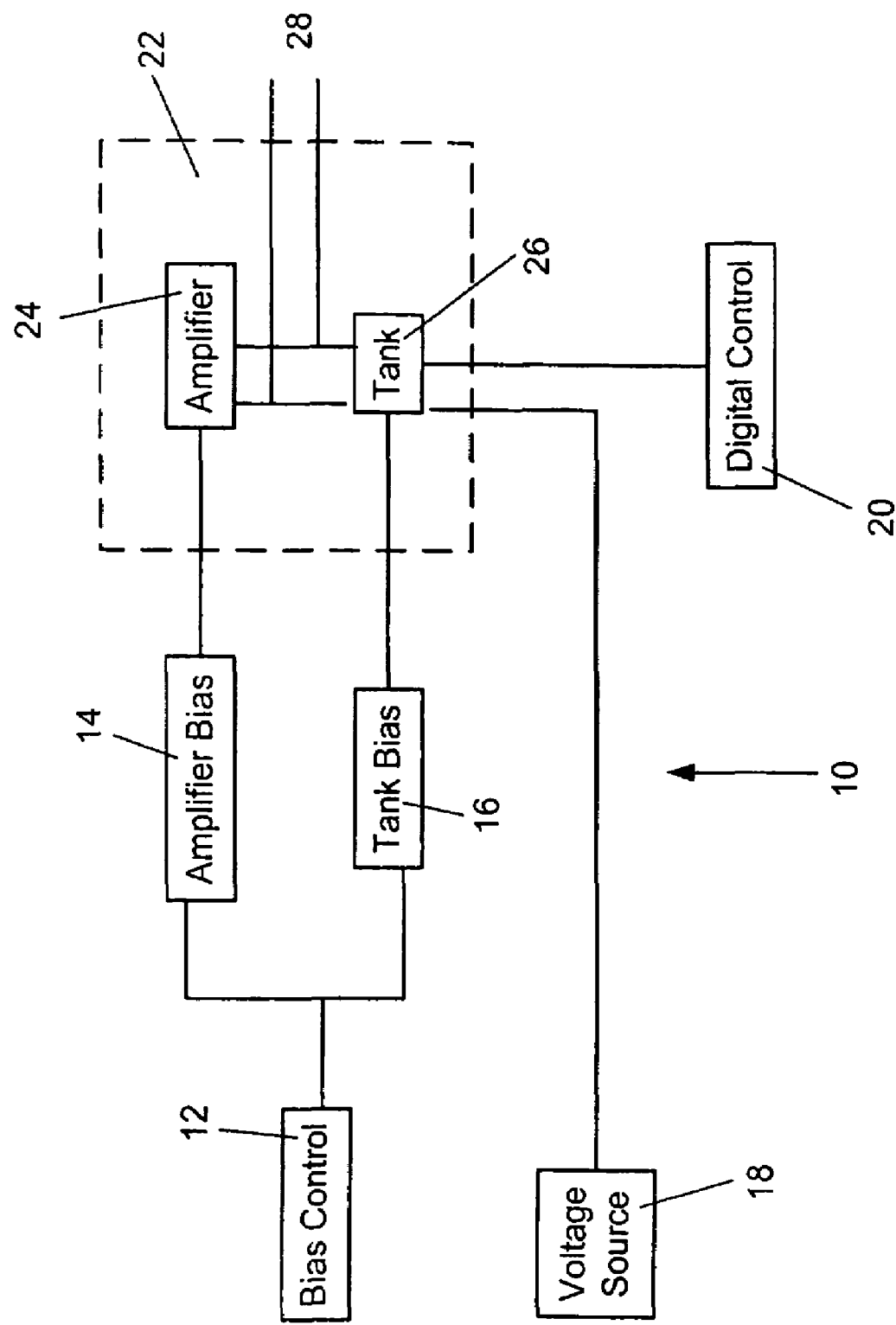
FIG. 1 is prior art of a block diagram of for a typical VCO.

Turning to FIG. 1, a schematic diagram of a prior art voltage-controlled oscillator (VCO) is shown. The VCO 10 comprises a bias control 12 which is connected to an amplifier bias 14 and a tank bias 16. A voltage source 18 and a digital control 20, along with the amplifier bias 14 and tank bias 16, are connected to a VCO core 22. The VCO core 22 comprises an amplifier 24, and a tank 26. The outputs from the amplifier 24 and the tank 26 are transmitted as an output voltage 28.

Figure 2:
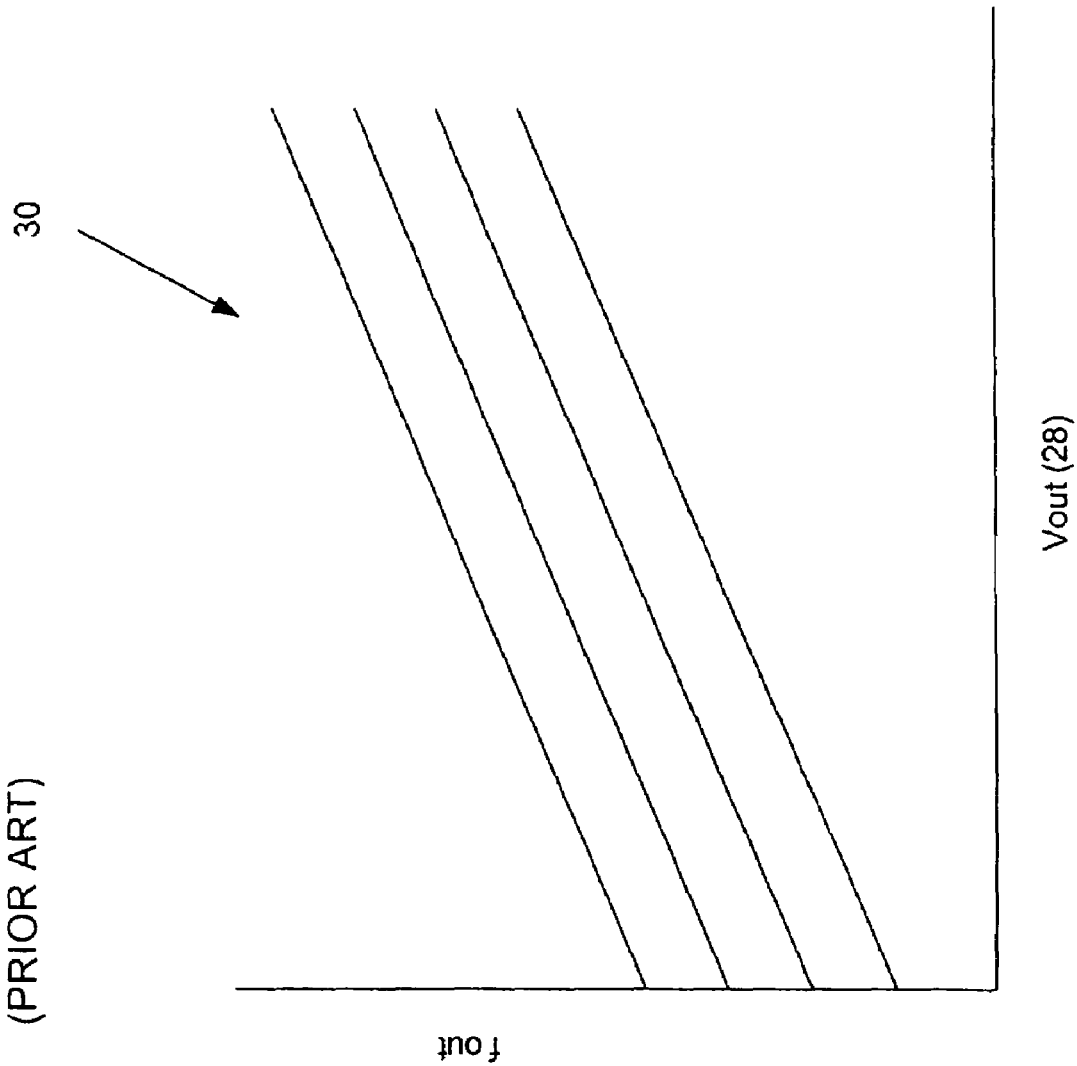
FIG. 2 is a graph of frequency versus voltage for a typical VCO.

FIG. 2 provides a graph 30 of the output voltage 28 with respect to the frequency at which the VCO 10 is operating.

Figure 3:
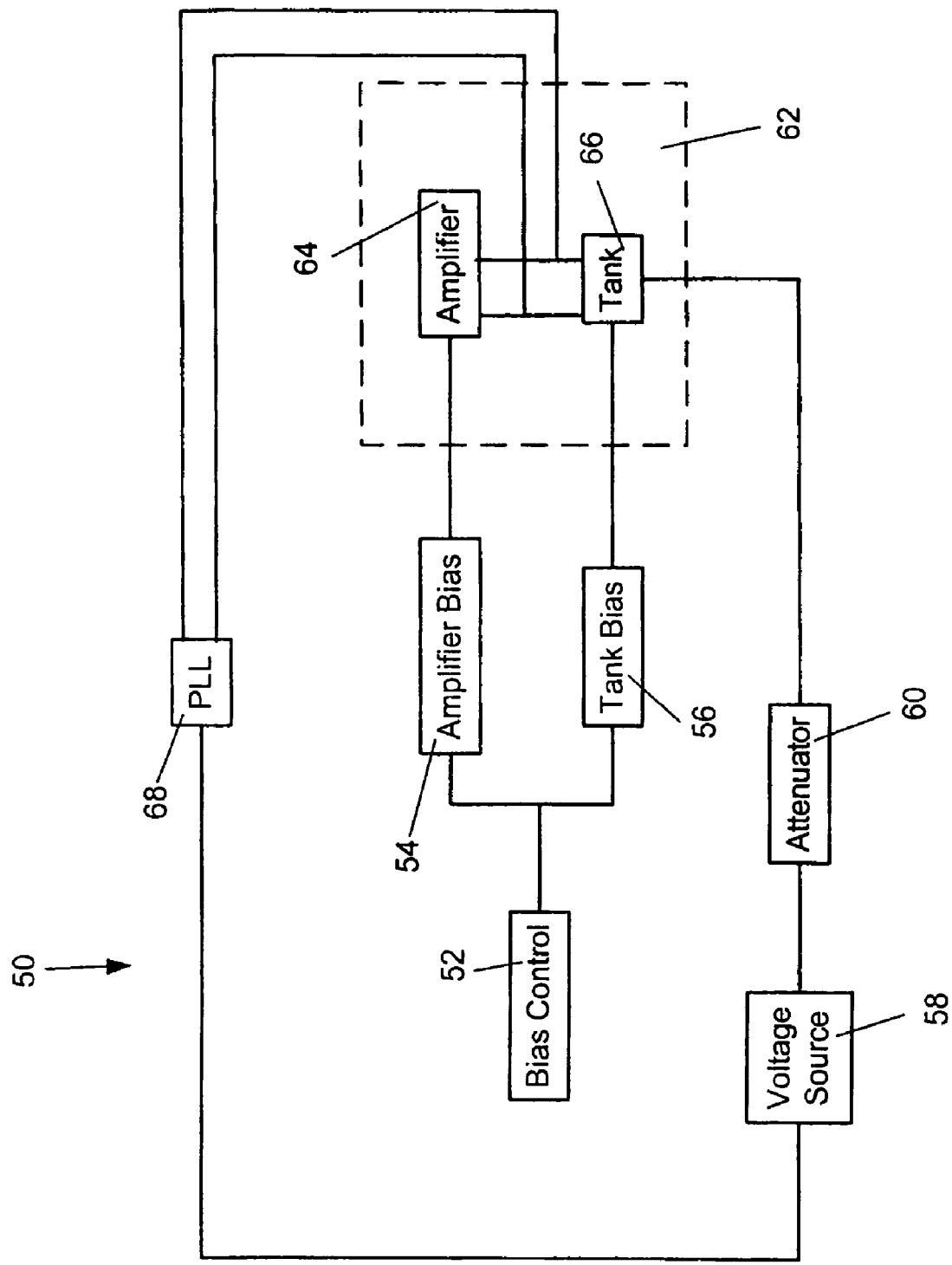
FIG. 3 is a block diagram outlining the general structure of the VCO.

Turning now to FIG. 3, apparatus for a reduced noise band switching circuit is shown. The apparatus is directed at a VCO for signal generation in wireless radio frequency (RF) applications. The apparatus, or VCO, 50 comprises a bias control 52 connected to an amplifier bias 54 and a tank bias 56. The two biases 54 and 56 are connected, along with a voltage source 58 which has been attenuated by attenuator 60, to a VCO core 62. The VCO core 62 comprises an amplifier, or amplifier circuit 64 and a tank, or tank circuit 66 and has its output connected to a phase locked loop (PLL) 68 which is connected to the input of the voltage source 58. Within the VCO core 62, the amplifier circuit 64 is coupled to the tank circuit 66 with the amplifier circuit 64 being biased by the amplifier bias 54 and the tank circuit 66 being biased by the tank bias 56.

In operation, the voltage source 58 generates an input voltage for the tank circuit 66 of the VCO core 62. Simultaneously, the bias control 12 transmits a first set of control signals to the amplifier bias 54 and a second set of control signal to the tank bias 56.

Figure 4:
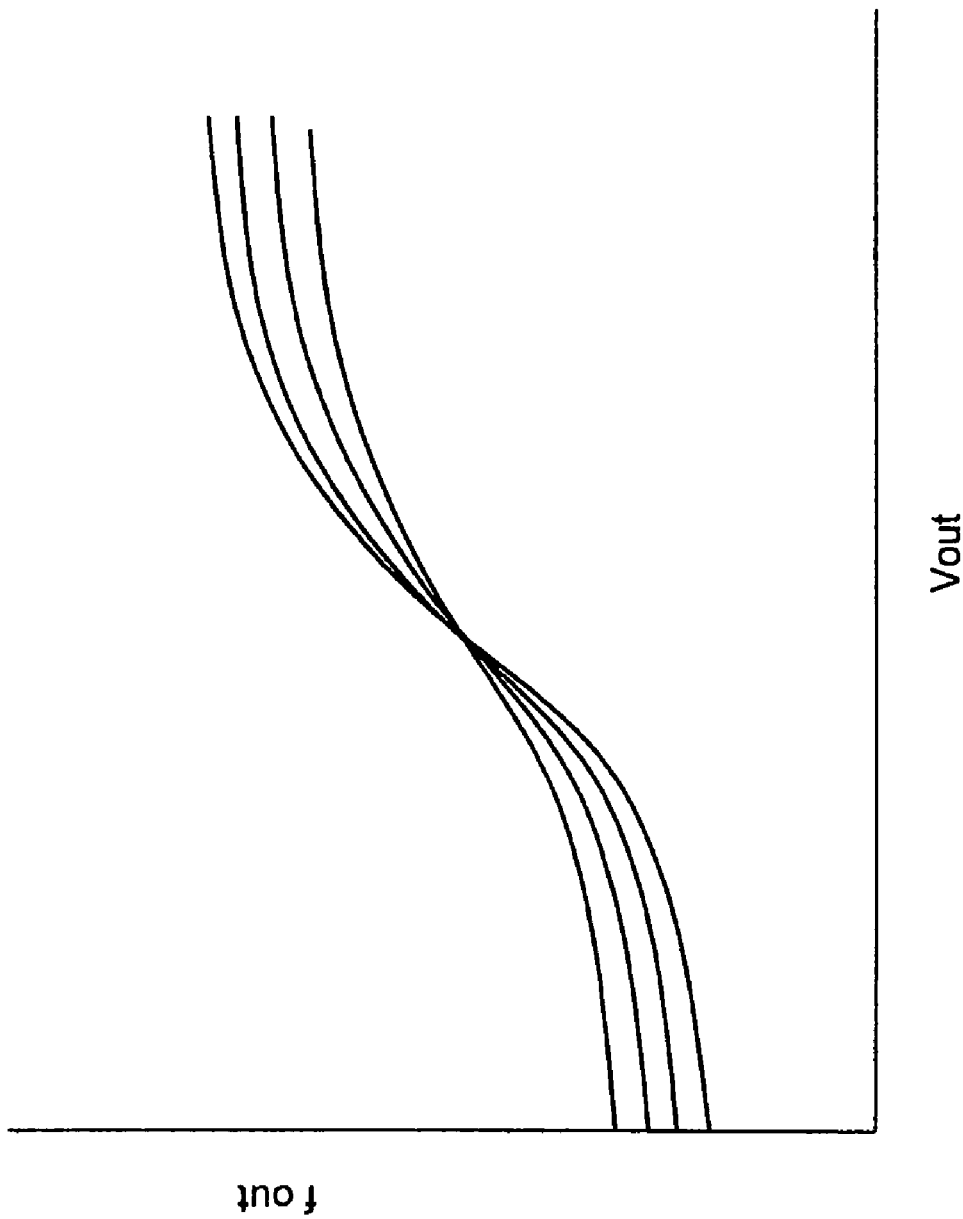
FIG. 4 is a graph of frequency versus voltage for a VCO of the present invention.

After the input voltage has been generated, it is transmitted to the attenuator 60 before being transmitted to the tank circuit 66. While the input voltage is being attenuated, the amplifier bias 54 and the tank bias 56 control operation of the amplifier circuit 64 and the tank circuit 66 by providing a noiseless bias voltage as will be described below. The combination of the attenuated input voltage and the noiseless biasing voltage results in an output which is also noiseless which results in a cleaner output signal. An example of the output is shown in FIG. 4 which shows the result of attenuation on the output frequency ($f_{out}$) in relation to the output voltage ($V_{out}$).

With attenuation, the slope of $f_{out}$ versus source voltage, or $K_{vco}$, decreases so that for any change in source voltage, there is a small change in $f_{out}$. A lower $K_{vco}$, results in a reduction in phase noise as shown in the following equation:

$$\text{phase noise} = a^2 V^2 \left(\frac{K_{vco}}{f}\right)^2$$

Therefore, the attenuation of the input voltage provides a reduced noise signal to the tank circuit, further allowing the output of the VCO core to be reduced in noise.

Figure 5:
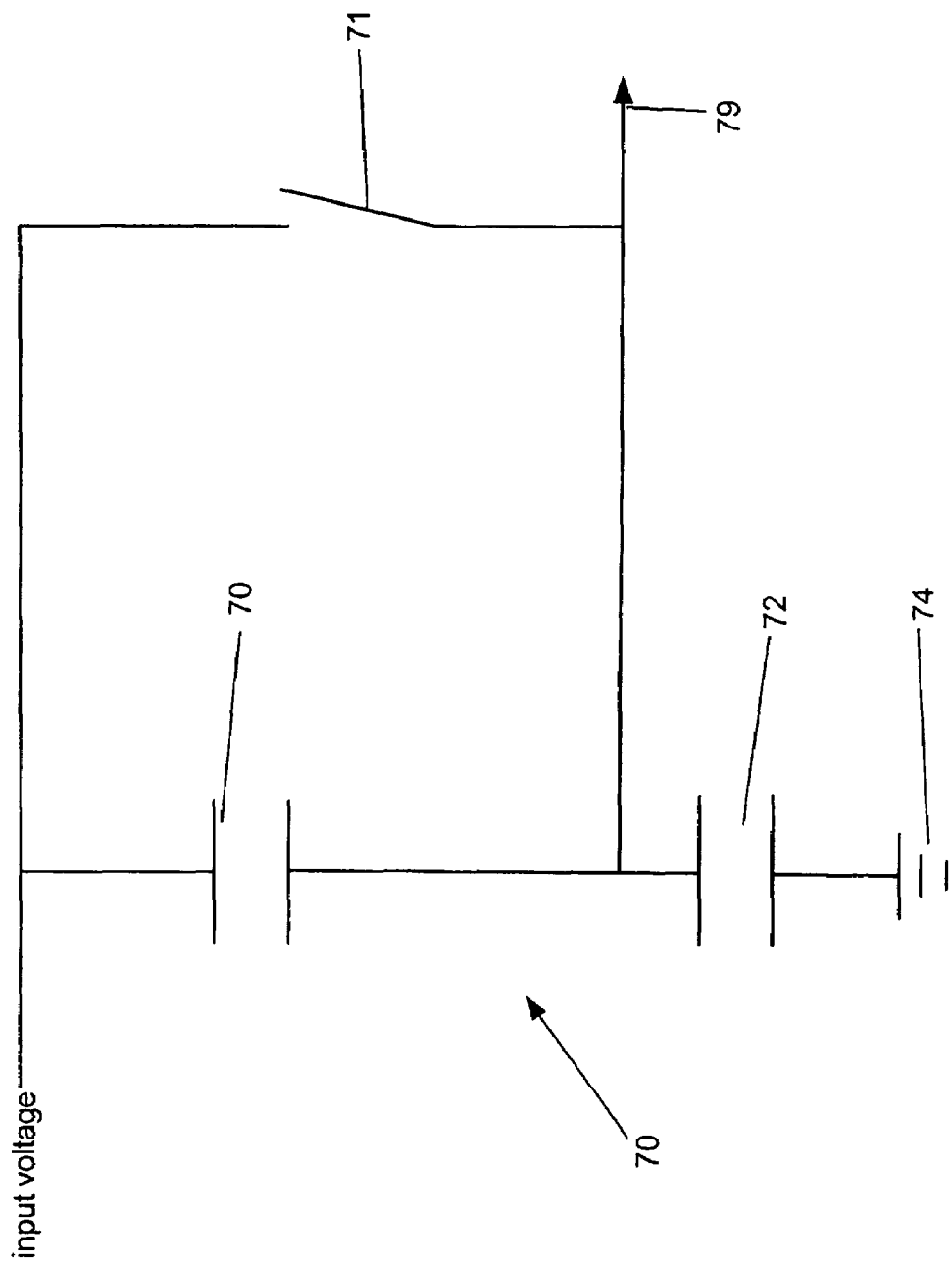
FIG. 5 is a diagram of a first embodiment of an attenuator.

Turning to FIG. 5, a first embodiment of the attenuator 60 is shown which is in the form of a capacitance voltage divider. The attenuator 60 comprises a first capacitor 70, also designated as C1 in the equation below, connected in series with a second capacitor 72, designated as C2 in the equation below, to ground 74. The attenuator 60 also includes a switch 71. The first capacitor 70 receives its input ($V_{in}$) from the voltage source 58 and an output ($V_{out}$) 80 of the attenuator 60 goes to the tank circuit 66 in the VCO core 62. The output 80 of the attenuator 60 is between the first and second capacitors 70 and 72. The capacitance voltage divider attenuates the input voltage as:

$$V_{out} = \alpha V_{in}$$

$$\text{where } \alpha = \frac{C_1}{C_1 + C_2}$$

When an input voltage is delivered, the phase lock loop 68 start operating and the switch 71 is closed (in the ON state) to create a path to charge the second capacitor 72 to the value of the input voltage ($V_{in}$). After the phase lock loop 68 has been able to lock, the capacitance voltage divider is seen as in a enabled state and therefore only a small loop gain is experienced at point A which also allows for the noise of the voltage signal to be reduced which, in turn, results in small variations in frequency due to noise. This is because the DC portion of the input voltage is relatively constant and the AC portion of the input voltage has been attenuated which causes the noise from the input voltage to also attenuate which, in turn, reduces the frequency variation due to noise.

Figure 9:
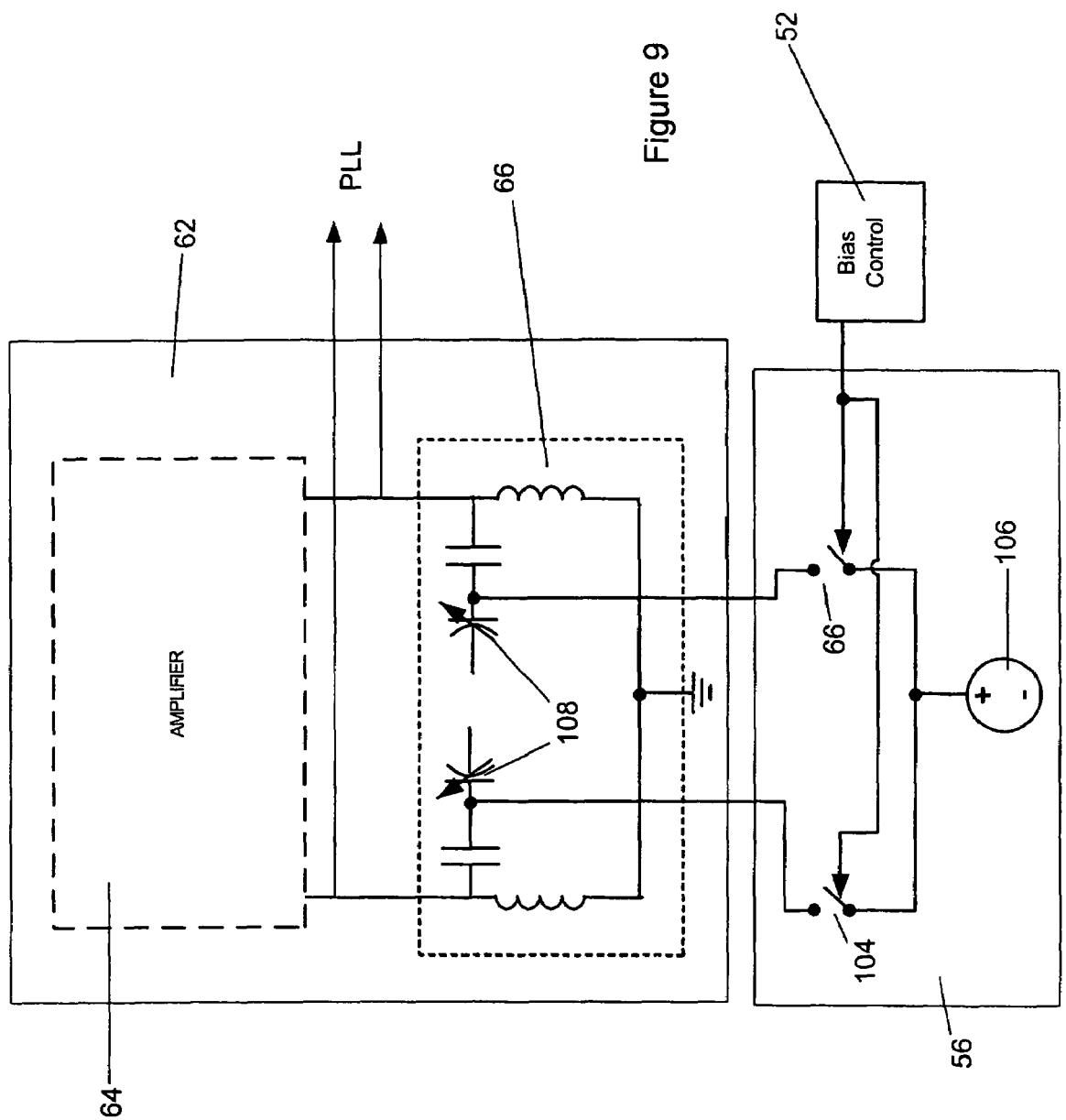
FIG. 9 is a diagram of the bias control, the tank bias and the VCO core.

The output 80 of the attenuator is connected to the tank circuit and acts as a tuning, or control, voltage for the tank circuit 66. The output of the attenuator is connected between a pair of varactors 108 as shown in FIG. 9.

Figure 6:
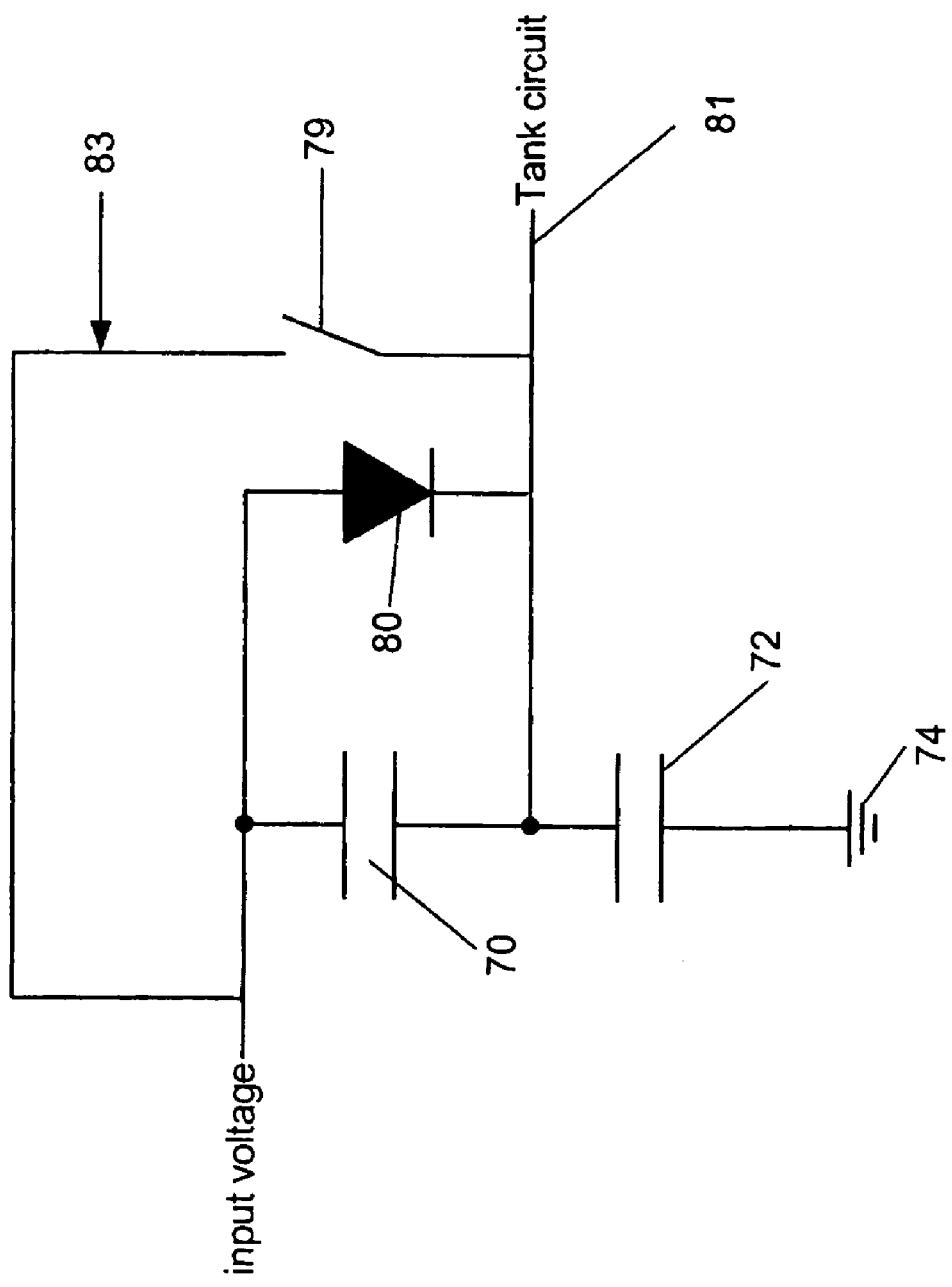
FIG. 6 is a diagram of a second embodiment of an attenuator.

FIG. 6 shows an alternate embodiment of the attenuator 60. In this embodiment, the attenuator 60 is similar to the embodiment of FIG. 5 with the addition of a diode 80. The diode 80 is preferably forward biased. Furthermore, an output 81 of the attenuator 60 is also fed back via a switch 79 to the input, $V_{in}$, of the attenuator in a negative phase lock loop 83. The feedback loops allows for correction of any variation in the input voltage to pull $V_{out}$ back to a desired voltage. Any loss in charge due to the leakage path resistance (the path provider by the resistor 78) is also corrected by the feedback loop 83 and the diode 80.

When an input voltage is delivered, the switch 79 is closed (in the ON state) to create a path to charge the second capacitor 72 to the value of the input voltage ($V_{in}$). After the second capacitor 72 reaches the value of $V_{in}$, the capacitance voltage divider is seen as in a enabled state and therefore only a small loop gain is experienced at point A which also allows for small variations in frequency due to noise.

Figure 6A:
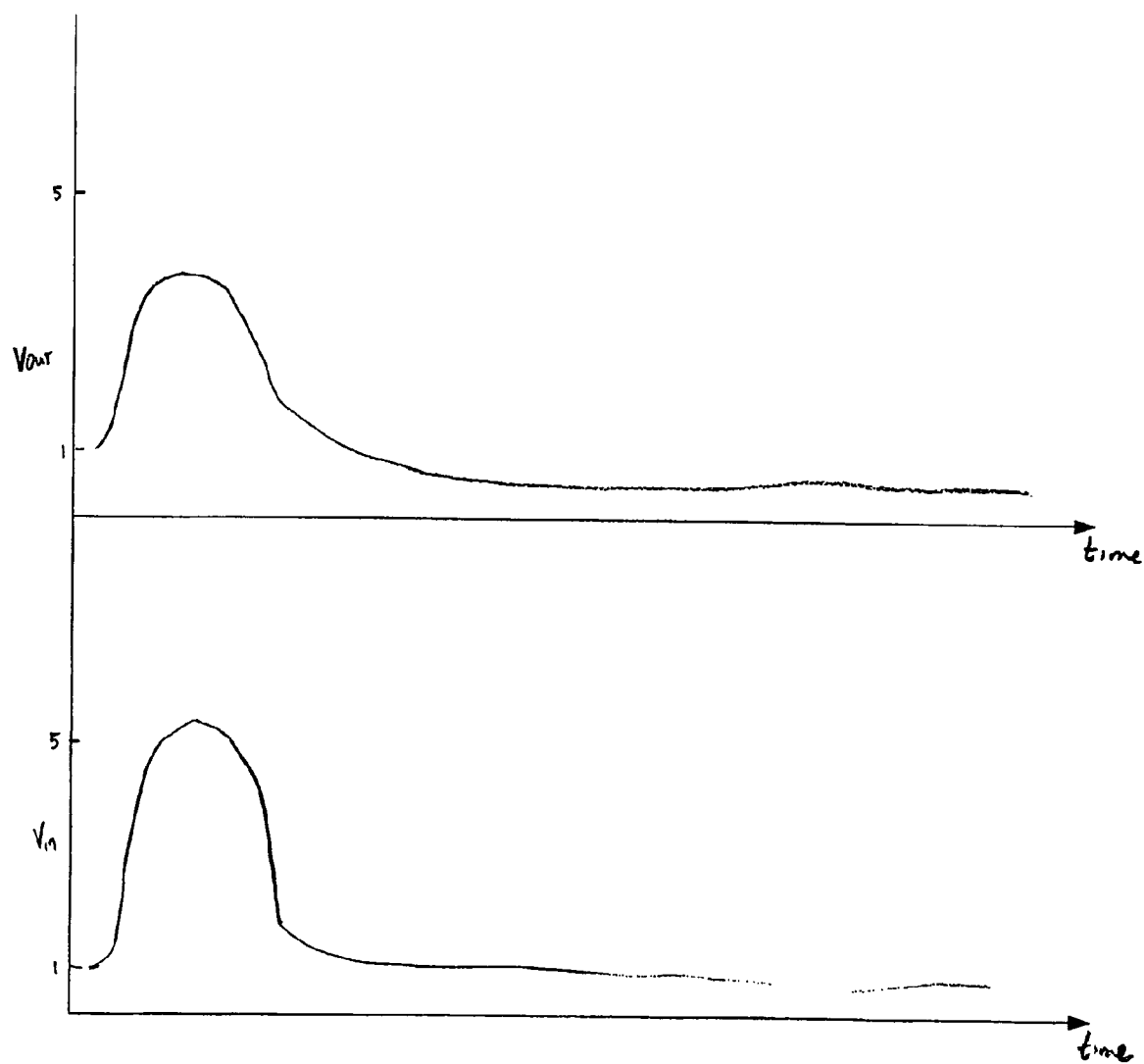
FIG. 6A is a graph showing the relationship between an input voltage and an output voltage of the attenuator of FIG. 6.

FIG. 6a shows a comparison of $V_{out}$ and input voltage $V_{in}$ over time.

With the negative feedback loop 83, when $V_{in}$ fluctuates to 5V, $V_{out}$ increases to 2.5 volts as determined by the capacitance divider equation, $V_{out}$ is then fed back to, which corrects the voltage source pulling $V_{in}$ back down to 1V.

Figure 7:
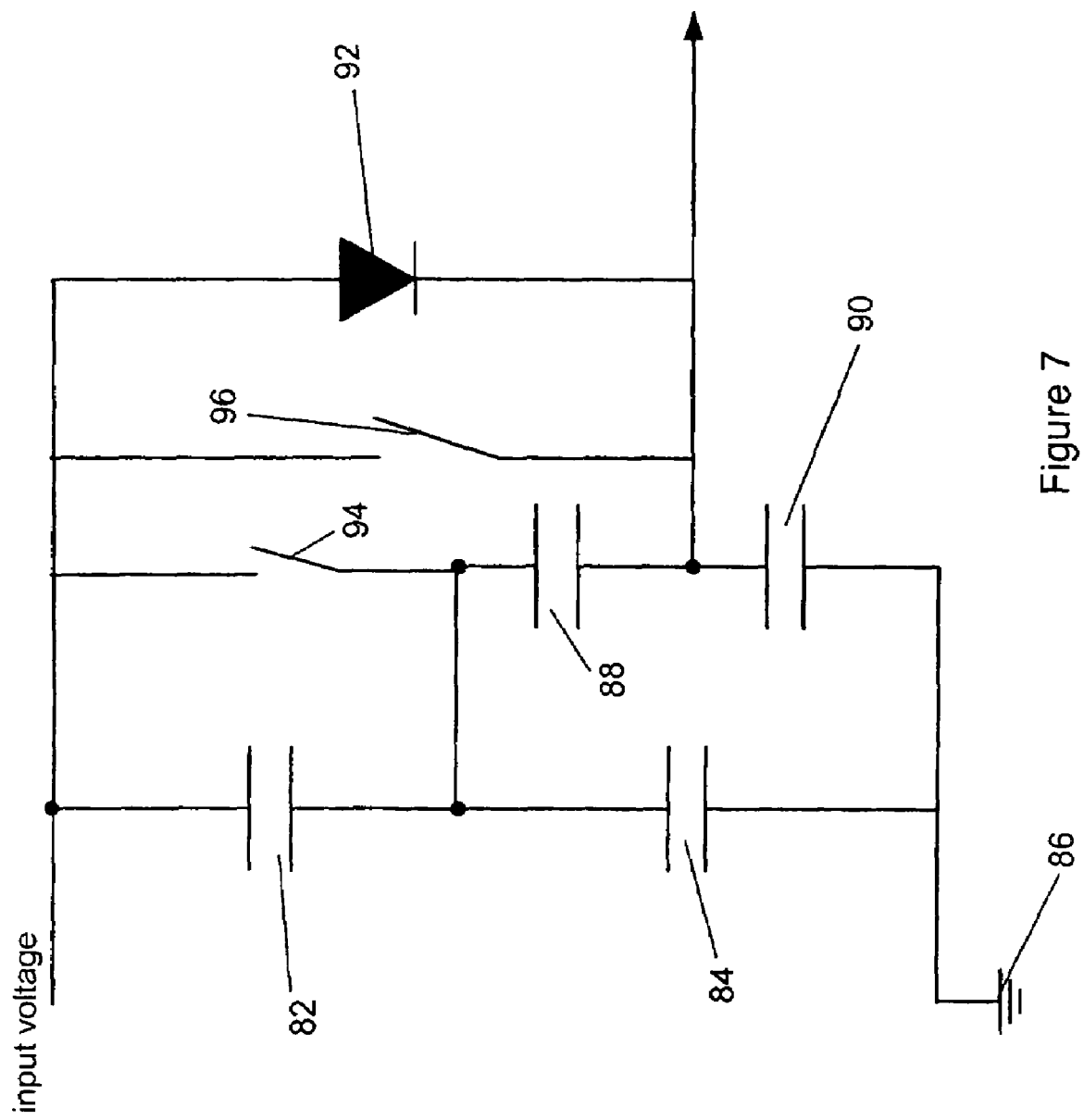
FIG. 7 is a diagram of a third embodiment of an attenuator.

FIG. 7 shows a further embodiment of the attenuator 60. In this embodiment, the attenuator 60 comprises a double capacitance voltage divider. The attenuator 60 receives its input ($V_{in}$) from the voltage source 58 and comprises a first capacitor 82 connected in series to a second capacitor 84 and ground 86. The first capacitor 82 is also connected to ground 86 via a third capacitor 88 and a fourth capacitor 90 which are connected in series. The third and fourth capacitors 88 and 90 are parallel to the second capacitor 84. The capacitors 82, 84, 88 and 90 are connected in parallel with a forward biasing diode 92. As further shown in the figure, a first capacitance voltage divider is divided by a second capacitance voltage divider such the first 82 and second 84 capacitors are divided by the third and fourth capacitors 88 and 90. The first 82 and third 88 capacitors are in parallel with the forward biased diode 92.

The attenuator 60 also comprises a pair of switches 94 and 96 which are used to assist in the charging of the capacitors during the initial period when the phase lock loop 68 is attempting to lock.

The output voltage $V_{out}$ is attenuated by the equation shown below:

$$V_{out} = \alpha V_{in}$$

$$\text{where } \alpha = \left(\frac{C_1}{C_1 + C_2}\right)\left(\frac{C_3}{C_3 + C_4}\right)$$

The attenuated output of the attenuator allows for a less noisy input voltage to the tank circuit 66 than if the voltage source 58 was connected directly to the tank circuit 66 since the double capacitance voltage divider lowers the value of α which in turn lowers the phase noise of the circuit.

Figure 8:
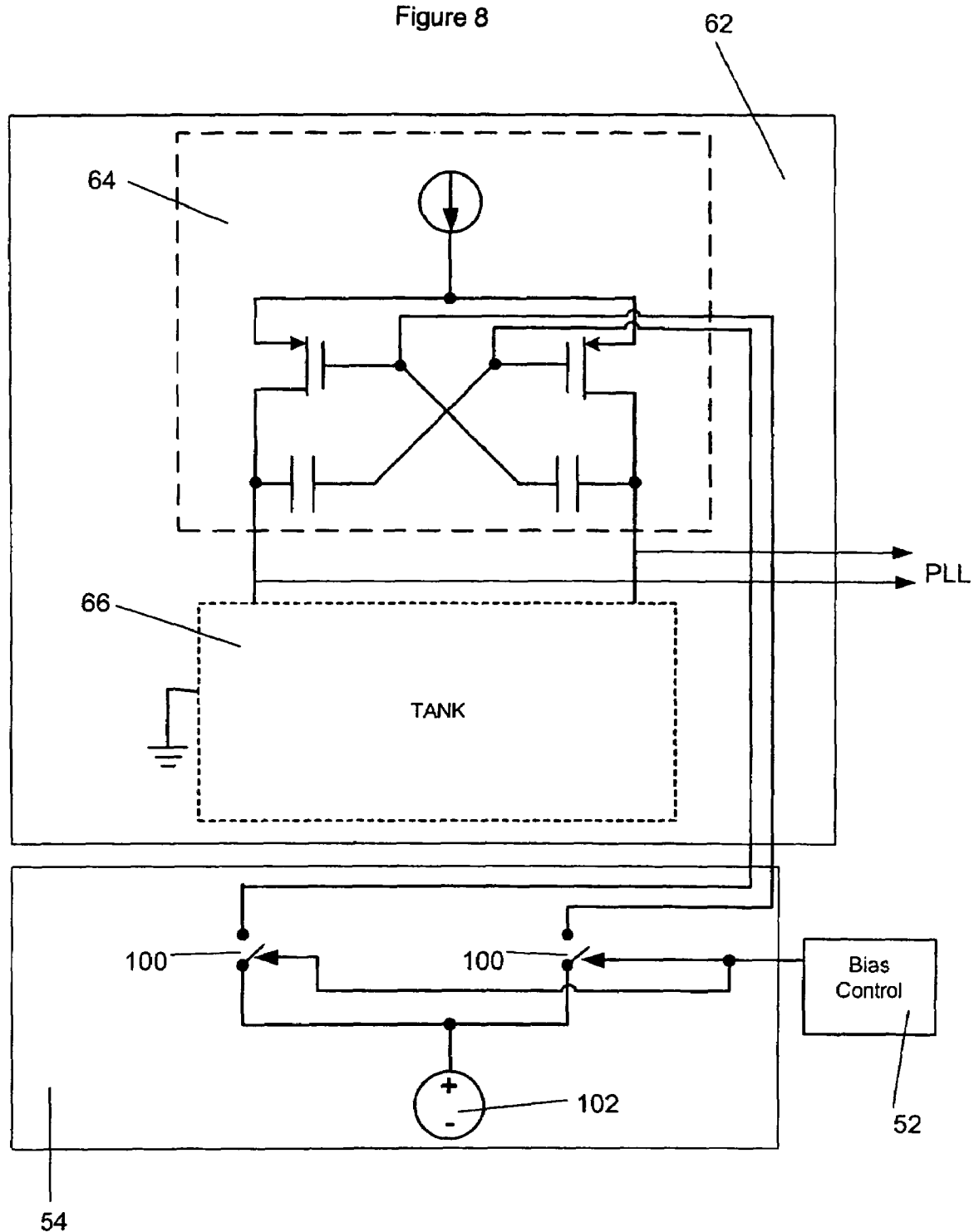
FIG. 8 is a diagram of the bias control, the amplifier bias and the VCO core.

Turning to FIG. 8, a schematic diagram of part of the VCO 50 is shown. The bias control 52 is connected to the amplifier bias 54 which is connected to the amplifier circuit 64 of the VCO core 62. Operation and the contents of the amplifier circuit 64 will be well known to one skilled in the art.

The amplifier bias 54 comprises a pair of switches 100 which are controlled by the bias control 52 along with an amplifier biasing voltage source 102. The bias control 52 also controls an amplifier biasing voltage source 102. In order to provide a noiseless bias voltage to the amplifier circuit 64, when the bias control 52 senses a logic high (indicating a power up state for the VCO 10), the first set of control signals are sent to the amplifier bias 54 and to the amplifier biasing voltage source 102, comprising an amplifier switch control signal and a $V_{biasamplifiercontrol}$ signal, respectively.

Upon receipt of the amplifier switch control signal, the switches 100 in the amplifier bias 54 close and, upon receipt of the $V_{biasamplifiercontrol}$ signal, the biasing voltage source 102 starts. The amplifier biasing voltage source 102 charges across the switches 100 to provide an output voltage to the amplifier circuit 64.

After a predetermined period of time, the bias control 52 transmits a signal to the amplifier bias 54 to open the switches 100. This occurs after the output voltage of the switches 100 has attained a predetermined value.

Figure 8A:
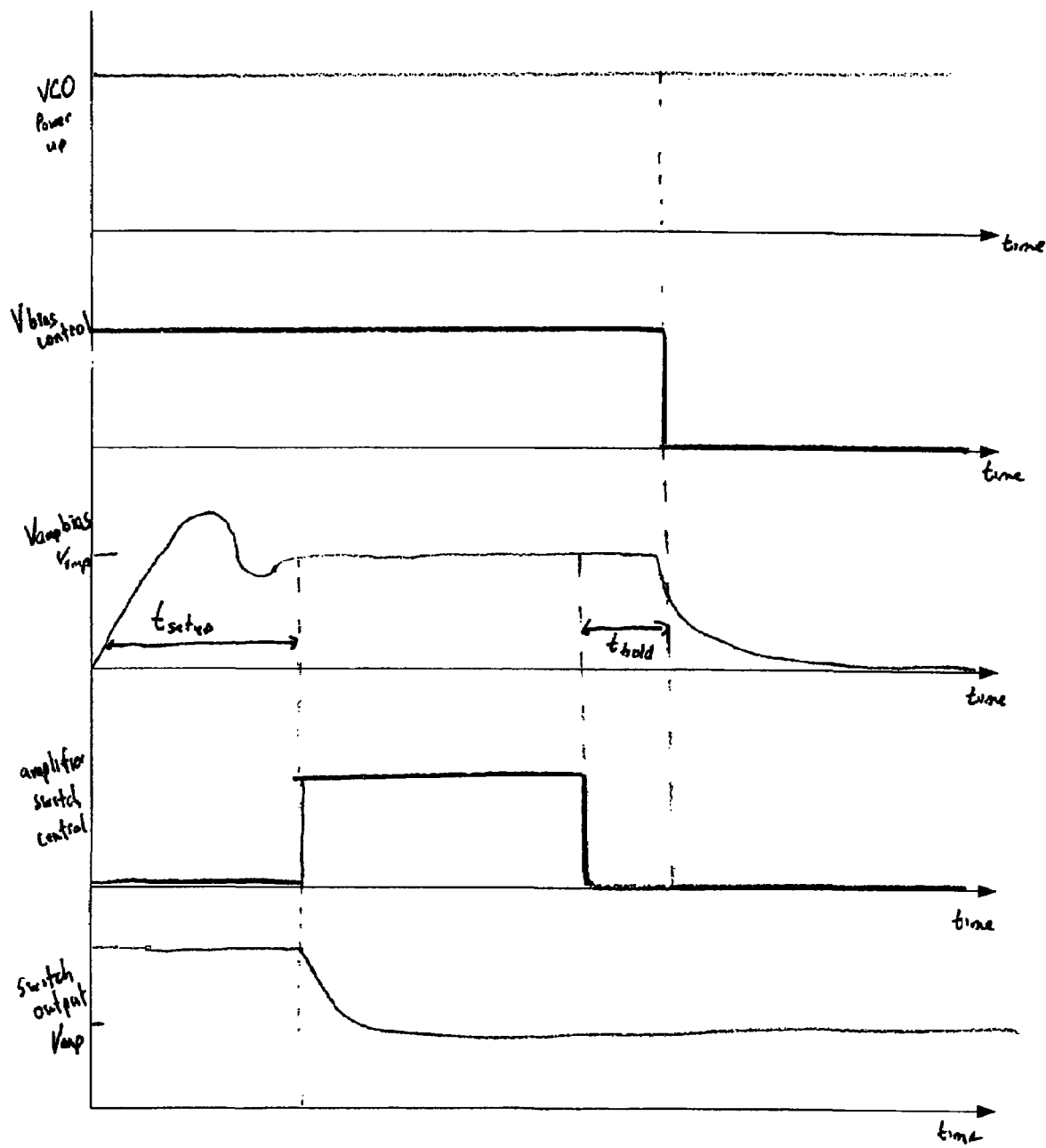
FIG. 8a is a graph showing a set of control signals for the apparatus of FIG. 8.

By opening the switches 100 after the predetermined voltage has been reached, the voltage being transmitted from the switches 100 to the amplifier circuit 64 may be seen as noiseless since there is no direct connection between the amplifier biasing voltage source 102 and the amplifier circuit 64. Therefore, the VCO core 62 may operate under noiseless bias conditions. A sample timing diagram is shown in FIG. 8a.

Turning to FIG. 9, a schematic diagram of the VCO core, the tank bias circuit and the bias control is shown. The bias control 52 is connected to the tank bias 56 which is connected to the tank circuit 66 of the VCO core 62. Operation and the contents of the tank circuit 64 will be well known to one skilled in the art.

As with the amplifier bias, the tank bias 56 comprises a pair of switches 104 which are controlled by the bias control 52 by the second set of control signals which includes a tank switch control signal. A tank bias voltage source 106 is controlled by a $V_{biastankcontrol}$ control signal which is transmitted by the bias control 52. Operation of the tank bias 56 is similar to the operation of the amplifier bias 54, as disclosed above with respect to FIG. 8.

Due to the size and costs of the parts required for the attenuators of the present invention, it will be understood that these attenuators are beneficial for use in integrated circuits.

The provision of an attenuated voltage and the bias control voltage to the VCO core, provides a reduced noise band switching circuit.

The above-described embodiments of the invention are intended as examples only. Alterations, modifications and variations may be effected to the particular embodiments by those of skill in the art without departing from the scope of the invention, which is defined solely by the claims appended hereto.

What is claimed is:

1. A low-phase noise voltage controlled oscillator (VCO) comprising:
   a voltage source for supplying a control voltage to said VCO core;
   a phase lock loop, having an output connected to an input of said voltage source;
   a VCO core, including an amplifier circuit and a tank circuit, having an output connected to an input of said phase lock loop;
   a capacitance divider circuit attenuator having a capacitive divider circuit including a first and a second capacitor, and a parasitic leakage path, said attenuator located between said voltage source and said VCO core, for reducing noise from said voltage source to said VCO core to reduce frequency variation of said voltage source.

2. The low -phase noise VCO of claim 1 further comprising:
   a diode coupled to said capacitive divider circuit.

3. The low-phase noise VCO of claim 2 wherein said diode is coupled in parallel to said first capacitor.

4. The low-phase noise VCO of claim 2 wherein said diode is forward biased.

5. The low-phase noise VCO of claim 3 further comprising:
   a feedback loop connecting an output of said attenuator to an input of said attenuator.

6. The low-phase noise VCO of claim 5 wherein said attenuator further comprises:
   a second capacitive divider located across said second capacitor.

7. The low-phase noise VCO of claim 1 further comprising:
   an amplifier bias connected to said amplifier circuit; and
   a tank bias connected to said tank circuit;
   wherein said amplifier bias controls a bias of said amplifier circuit and said tank bias controls a bias of said tank circuit.

8. The low-phase noise VCO of claim 7 further comprising a bias control connected to said amplifier bias and said tank bias for controlling said amplifier bias and said tank bias.

9. The low-phase noise VCO of claim 7 wherein said amplifier bias further comprises:
   an amplifier biasing voltage source; and
   a pair of switches which are opened and closed by said bias control;
wherein when said switches are opened, said switches provide a path for a voltage from said amplifier biasing voltage source to said amplifier circuit and when said switches are closed said amplifier biasing voltage source is disconnected from said amplifier circuit.

10. The low-phase VCO of claim 7 wherein said tank bias further comprises:
    a tank biasing voltage source; and
    a pair of switches which are opened and closed by said bias control;
wherein when said switches are opened, said switches provide a path for a voltage from said tank biasing voltage source to said tank circuit and when said switches are closed said tank biasing voltage source is disconnected from said tank circuit.

11. A method of reducing noise in a voltage controlled oscillator (VCO) comprising steps of:
    providing an attenuated voltage to a VCO core comprising an amplifier circuit and a tank circuit;
    reducing noise in an output of said VCO core via an amplifier bias connected to said amplifier circuit including amplifier switches and via a tank bias connected to said tank circuit including tank switches;
    transmitting a close amplifier switches signal to said amplifier switches; closing said amplifier switches;
    transmitting a voltage from a biasing voltage source to said amplifier circuit via said closed amplifier switches; and
    opening said amplifier switches to disconnect said amplifier circuit from said biasing voltage source after a predetermined time to reduce noise supplied to said amplifier circuit from said biasing voltage source.

12. The method of claim 11 further comprising, before said step of opening said amplifier switches, a step of:
    transmitting an open amplifier switches signal to said amplifier switches.

13. The method of claim 12 wherein said step of biasing comprises steps of:
    transmitting a close tank switches signal to said tank switches; closing said tank switches;
    transmitting a voltage from a biasing voltage source to said tank circuit via said closed tank switches; and opening said tank switches to disconnect said tank circuit from said biasing voltage source after a predetermined time to reduce noise supplied to said tank circuit from said biasing voltage source.

14. The method of claim 13 further comprising, before said step of opening said tank switches, a step of:
   transmitting an open tank switches signal to said tank switches.

15. The method of claim 12 wherein said step of providing an attenuated voltage comprises:
   receiving an input voltage from a voltage source;
   capacitive dividing said input voltage; and
   transmitting said attenuated voltage to said VCO core.

16. The method of claim 15 wherein said step of providing an attenuated voltage further comprises a step of:
   transmitting said attenuated voltage in a feedback loop to said input voltage.

17. The method of claim 15 wherein said step of providing an attenuated voltage further comprises, before said step of transmitting said attenuated voltage, a step of:
   capacitive dividing said voltage resulting from said step of capacitive dividing said input voltage.

* * * * *